(12) United States Patent
De Vita et al.

(10) Patent No.: US 8,843,093 B2
(45) Date of Patent: Sep. 23, 2014

(54) LOW POWER SQUELCH DETECTOR CIRCUIT

(71) Applicant: Intel Corporation, Santa Clara, CA (US)

(72) Inventors: Michael V. De Vita, Martinez, CA (US); Roan M. Nicholson, San Jose, CA (US); Shenggao Li, Pleasanton, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/722,615

(22) Filed: Dec. 20, 2012

(65) Prior Publication Data

US 2014/0176193 A1    Jun. 26, 2014

(51) Int. Cl.
*H04B 1/10* (2006.01)
*H03K 5/22* (2006.01)
*H03K 5/24* (2006.01)

(52) U.S. Cl.
CPC .................................. *H03K 5/24* (2013.01)
USPC ............................ 455/222; 455/218; 375/351

(58) Field of Classification Search
CPC ......... H04B 1/10; G06F 13/4072; H03G 3/34
USPC ........... 455/218, 222, 254, 226.1; 327/58, 65, 327/72, 551; 375/351
See application file for complete search history.

(56) References Cited

U.S. PATENT DOCUMENTS

| | | | | |
|---|---|---|---|---|
| 6,246,268 B1* | 6/2001 | Cheng | | 327/65 |
| 6,377,082 B1* | 4/2002 | Loinaz et al. | | 327/20 |
| 6,859,645 B2* | 2/2005 | Yu | | 455/222 |
| 6,897,712 B2* | 5/2005 | Ficken et al. | | 327/537 |
| 7,471,118 B2* | 12/2008 | Liu | | 327/58 |
| 7,724,645 B2* | 5/2010 | Bedwani et al. | | 370/216 |
| 7,812,591 B1* | 10/2010 | Pan et al. | | 324/76.11 |
| 8,497,711 B2* | 7/2013 | Hsieh | | 327/58 |
| 8,538,362 B2* | 9/2013 | Srivastava et al. | | 455/218 |
| 8,542,035 B2* | 9/2013 | Park et al. | | 327/65 |
| 2013/0029622 A1* | 1/2013 | Zhan | | 455/218 |
| 2013/0251016 A1* | 9/2013 | Yap et al. | | 375/224 |

OTHER PUBLICATIONS

Stojanovic, V., et al., "Comparative Analysis of Latches and Flip-Flops for High-Performance Systems", *Cited in Computer Design: VLSI in Computers and Processors, 198. ICCE '98.* Oct. 5-7, 1998. 6 pages. http://www.rle.mit.edu/isg/documents/stojanovic_iccd98.pdf.

* cited by examiner

*Primary Examiner* — Blane J Jackson
(74) *Attorney, Agent, or Firm* — Green, Howard & Mughal, LLP

(57) ABSTRACT

Described is an apparatus comprising: a reference generator to provide a first reference and a second reference; a first input coupled to the first reference; a second input coupled to the second reference; and a comparator coupled to the first and second inputs, the comparator to receive a clock signal and to update an output signal according to a phase of the clock signal.

20 Claims, 5 Drawing Sheets

LOW POWER SQUELCH DETECTOR CIRCUIT

BACKGROUND

A squelch detector is typically used for detecting activity on a signal line and to determine whether that activity on the signal line qualifies as a signal for processing or is simply noise. Squelch detectors are generally operative when most of the processor, in which the squelch detector resides, is in low power mode (or idle mode, sleep mode, etc.). However, current squelch detectors consume high power which is not compatible with low power processor objectives.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
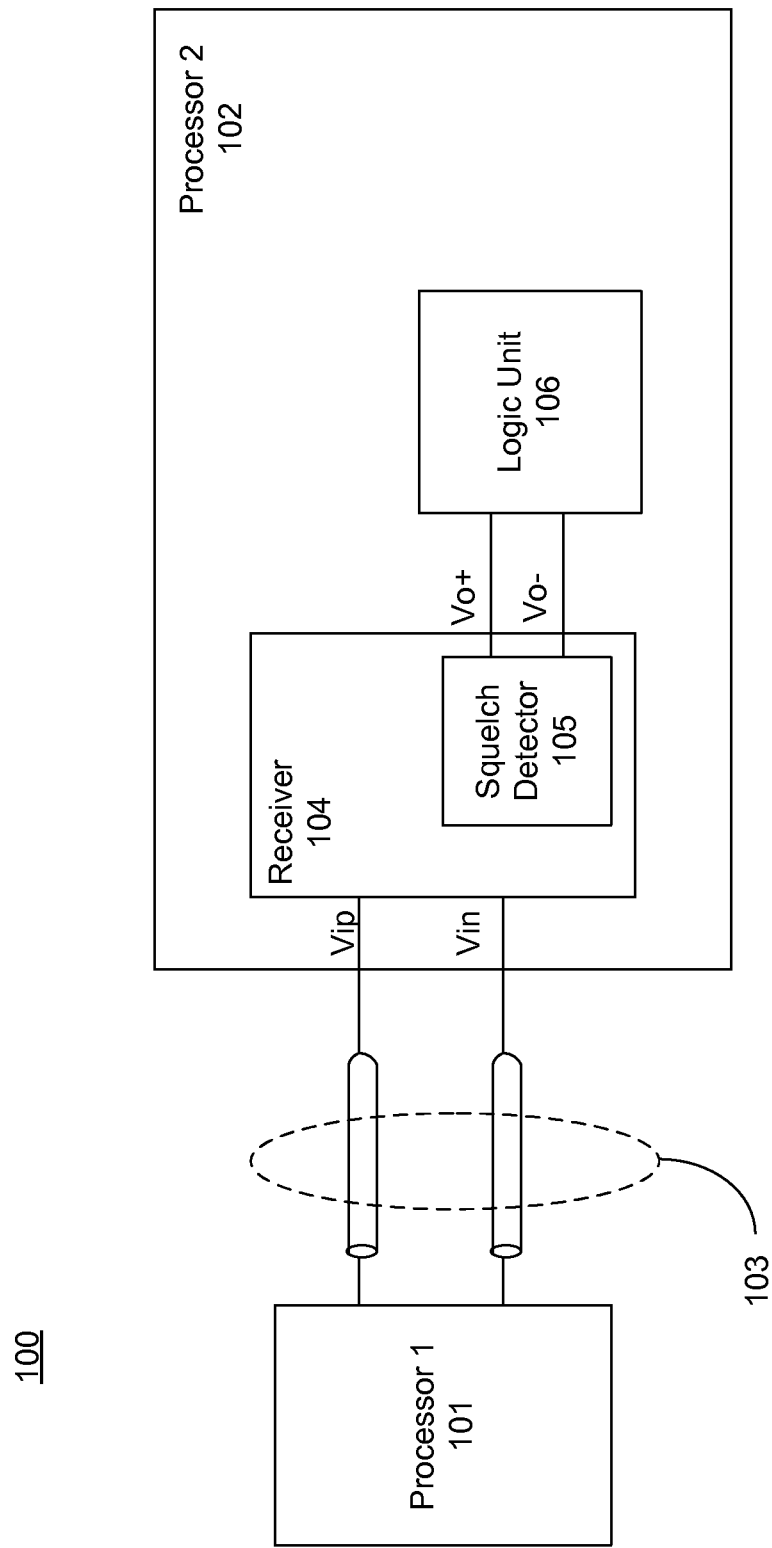
FIG. 1 is a computer or communication system with a receiver having a squelch detector, according to one embodiment of the disclosure.

The embodiments disclose a low power squelch detector that consumes less power consumption than a typical switch capacitor based squelch detector or a basic amplifier based squelch detector. For example, the low power squelch detector consumes 85% lesser power consumption than a typical switch capacitor based squelch detector.

In one embodiment, the low power squelch detector comprises a reference generator to provide a first reference and a second reference; a first input coupled to the first reference; a second input coupled to the second reference; and a comparator coupled to the first and second inputs, the comparator to receive a clock signal and to update an output signal according to a phase of the clock signal. In one embodiment, the comparator comprises a sense amplifier latch which is operable to sense a difference between signals on the first and second inputs with respect to a difference between the first and second references. In one embodiment, the clock signal is locally generated by a ring oscillator powered by a power supply, which is ON when the processor lowers its power supplies in idle mode.

In one embodiment, the squelch detector is used in high-speed input-output (I/O) link (serial or parallel). In one embodiment, the high-speed I/O link is a Peripheral Component Interconnect Express (PCIe) link. In one embodiment, the high-speed I/O link is a Universal Serial Bus (USB) 'X' System, where 'X' is a number which is 2 or greater.

In one embodiment, the squelch detector monitors input signals received by the receiver of the I/O link when the processor (of the receiver) is in low power mode (e.g., sleep mode, idle mode) and determines whether the input signals are data or noise. In one embodiment, when the squelch detector determines that the input signals are data, it turns ON (or assists in turning on) the receiver so that the receiver can process the incoming input signal. In one embodiment, when the squelch detector determines that the input signals are noise, then it keeps the receiver in low power mode. In one embodiment, the squelch detector measures peak-to-peak values of the input signals to determine whether the input signals are data or noise. In a PCIe I/O link, a signal below 65 mVpp is considered noise while signals above 175 mVpp is data, where "Vpp" is peak to peak signal swing or differential voltage between V+ (Vip) and V− (Vin) signals.

To conserve power for a processor, any component that can remain in low power mode for a longer time assists in keeping the overall power of the processor low. Accordingly, unused component(s) in the I/O link are usually turned OFF or otherwise powered down when the squelch detector detects that there is no communication signal being sent or received on the I/O link. In one embodiment, if the power level of the communication signal (received by the receiver and monitored by the squelch detector) drops below a given threshold level, the squelch detector generates a detector output signal indicating that the I/O link channel is inactive. In such an embodiment, detector output signal is then used to power down the unused component(s). In one embodiment, if the power level of the communication signal monitored by the squelch detector is greater than the given threshold level, the squelch detector changes the detector output signal to indicate an active status so as to power up the component(s) in the computer/communication system.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical connection between the things that are connected, without any intermediary devices. The term "coupled" means either a direct electrical connection between the things that are connected, or an indirect connection through one or more passive or active intermediary devices. The term "circuit" means one or more passive and/or active components that are arranged to cooperate with one another to provide a desired function. The term "signal" means at least one current signal, voltage signal or data/clock signal. The meaning of "a", "an", and "the" include plural references. The meaning of "in" includes "in" and "on."

The term "scaling" generally refers to converting a design (schematic and layout) from one process technology to another process technology. The term "scaling" generally also refers to downsizing layout and devices within the same technology node. The terms "substantially," "close,"

"approximately," "near," "about," generally refer to being within +/−20% of a target value.

Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For purposes of the embodiments described, the transistors are metal oxide semiconductor (MOS) transistors, which include drain, source, gate, and bulk terminals. The transistors may also include Tri-gate transistors and/or FinFETs. Source and drain terminals may be identical terminals and are interchangeably used in the disclosure. Those skilled in the art will appreciate that other transistors, for example, Bi-polar junction transistors—BJT PNP/NPN, BiCMOS, CMOS, eFET, etc., may be used without departing from the scope of the disclosure. The term "MN" indicates a n-type transistor (e.g., NMOS, NPN BJT, etc.) and the term "MP" indicates a p-type transistor (e.g., PMOS, PNP BJT, etc.).

The term "power mode" generally refers to power states of a processor as defined by the Advanced Configuration and Power Interface (ACPI) specification (for example, Revision 5.0, published on Nov. 23, 2011) which provides an open standard for device configuration and power management by an operating system. However, the embodiments are not limited to the ACPI low power states. Other specifications that offer lower power states for a processor may be used with the embodiments of the squelch detector.

FIG. 1 is a computer/communication system 100 with a receiver having a squelch detector according to one embodiment of the disclosure. In one embodiment, computer/communication system 100 comprises a processor 1-101 coupled to another processor 2-102 via a communication media 103. In one embodiment, processor 2-102 comprises a receiver 104 to receive differential input signals Vip and Vin. In one embodiment, receiver 104 comprises a low power squelch detector 105 which monitors the differential input signals Vip and Vin and determines whether the signals are data or noise. In one embodiment, squelch detector 105 generates an output differential signal Vo+ and Vo− that indicate to a logic unit 106 that the input signals Vip and Vin are data or noise.

In one embodiment, squelch detector 105 comprises a strong arm sensing amplifier which is operable by a clock signal used for sampling data Vip and Vin. In one embodiment, the clock signal is generated by a local ring oscillator. In such an embodiment, the clock signal does not depend on the I/O clock distribution network. In one embodiment, the local ring oscillator is operable to generate a clock signal with frequency which is two times greater (across power-temperature and voltage variations) than the frequency (or tone) of the input signals Vip and Vin. For example, for PCIe I/O links, the ring oscillator generates a clock signal having a frequency of 2 GHz. In other embodiments, for other types of differential signal patterns, the ring oscillator frequency can be adjusted accordingly.

In one embodiment, logic unit 106 includes a counter (not shown) to convert the toggling bit-stream of signals Vo+ and Vo− into a squelch/un-squelch indicator which informs receiver 104 (or any other part of processor 2-102) to process incoming data Vip/Vin (i.e., to power up) or to remain powered down because the incoming data Vip/Vin is noise. So as not to obscure the embodiments of the disclosure, nodes and signals on the nodes are interchangeably used. For example, nodes Vo+ and Vo− are also referred to as signals Vo+ and Vo− which indicate the corresponding signals on nodes Vo+ and Vo−. Likewise nodes Vip and Vin are also referred to as signals Vip and Vin which indicate the corresponding signals on nodes Vip and Vin.

Figure 2:
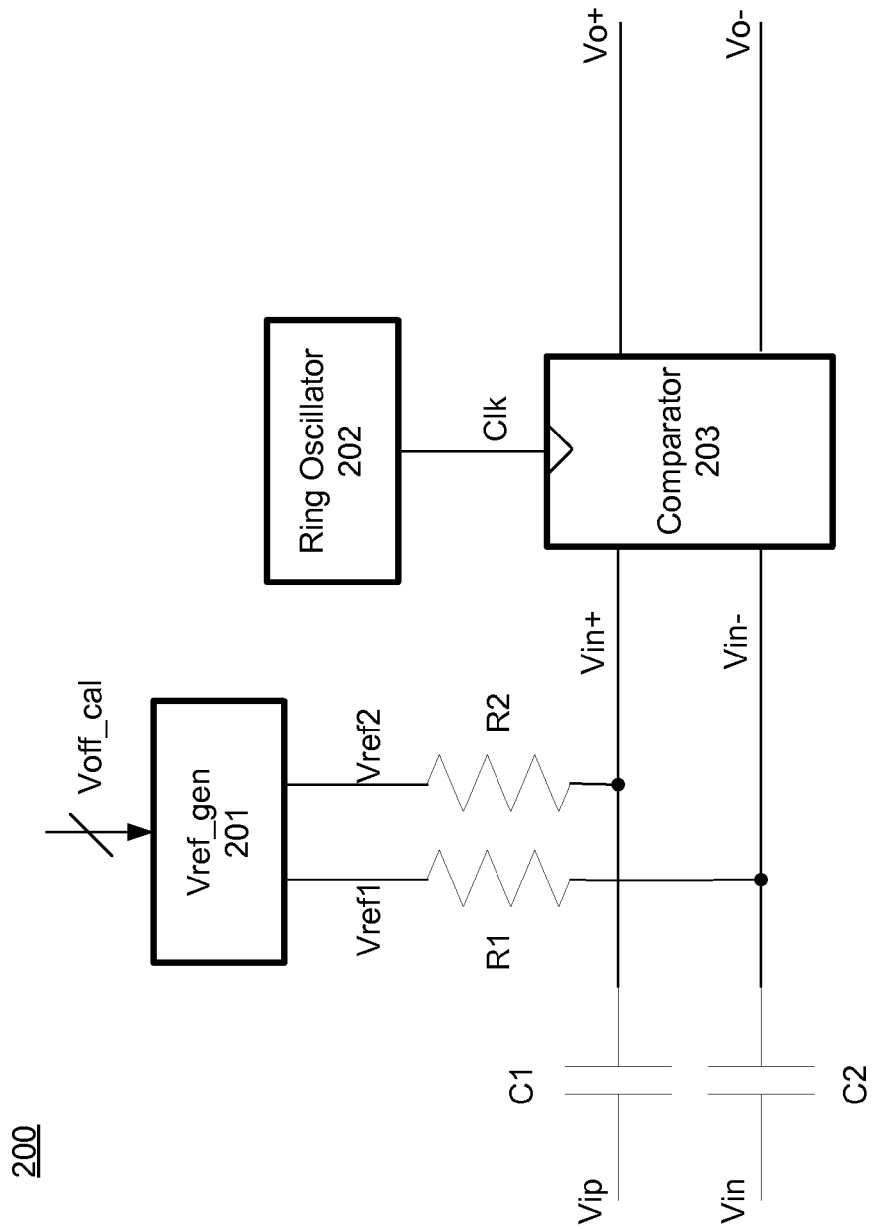
FIG. 2 is a squelch detector, according to an embodiment of the disclosure.

FIG. 2 is a squelch detector 200 (e.g., 105), according to an embodiment of the disclosure. It is pointed out that those elements of FIG. 2 having the same reference numbers (or names) as the elements of any other figure can operate or function in any manner similar to that described, but are not limited to such.

In one embodiment, squelch detector 200 comprises a voltage generator 201 (Vref_Gen), a sampling comparator 203 (also referred to as switching comparator), and a ring oscillator 202. In one embodiment, voltage generator 201 (also referred to as reference generator 201) generates a pair of reference voltages Vref1 (also referred as first reference) and Vref2 (also referred as second reference). In one embodiment, the difference between Vref1 and Vref2 is used to determine the threshold for detecting data or noise on signals Vip (also referred as first input) and Vin (also referred as second input).

In one embodiment, reference generator 201 is operable to adjust the levels of Vref1 and Vref2. For example, in one embodiment reference generator 201 receives a select signal to adjust the levels of Vref1 and Vref2. In one embodiment, reference generator 201 receives a digital signal Voff_cal to calibrate the offset of the sampling comparator 203. For example, Vref1 and Vref2 are skewed relative to one another to cancel any inherent offset in the comparator 203.

In ideal conditions, sampling comparator 203 will output a low voltage (GND) when no voltages are applied to the inputs of sampling comparator 203. However, due to the non-idealities of the devices used in sampling comparator 203, the output is not always a low voltage. Instead, a higher voltage than desired may appear at the output of sampling comparator 203. To compensate for this higher voltage, an offset voltage is applied to bias the two inputs of sampling comparator 203 so that the output voltage is set back to GND.

In one embodiment, squelch detector 200 uses a threshold voltage, for example, Vx=Vref1−Vref2 to determine if the signals Vip and Vin are data or noise. When sampling comparator 203 has an offset voltage Voff, the effective threshold voltage for sampling comparator 203 may make the squelch threshold to become Vx+/− Voff. In one embodiment, squelch detector 200 is operable to calibrate out offset voltage Voff from the threshold.

For example, in one embodiment Vref1−Vref2 is swept using the signal (code) Voff_cal until the outputs (Vo+ and Vo−) of the sampling comparator 203 changes polarity. In one embodiment, offset code (of Voff_cal) that causes the outputs (Vo+ and Vo−) of the sampling comparator 203 to change polarity can be subtracted from the nominal Vx code to calibrate Vx. In other embodiments, other methods for calibrating Voff of the sampling comparator 203 can be used.

In one embodiment, reference voltages Vref1 and Vref2 are coupled to input nodes of the sampling comparator 203 via resistors R1 and R2 respectively. In one embodiment, resistors R1 and R2 are used so that Vref1 and Vref2 are not permanently forced onto the inputs of the sampling comparator 203. In one embodiment, resistances of R1 and R2 are large enough so as not to distort input signals Vip and Vin, but not so large that they are unable to change the input to the sampling comparator 203 when no input signals are present. In one embodiment, resistors R1 and R2 are used for DC (direct current) biasing. In one embodiment, the resistances for the resistors R1 and R2 are in the range of 10 kOhms. In other embodiments, other resistances for the resistors R1 and R2 may be used.

In one embodiment, squelch detector 200 comprises capacitors C1 and C2 coupled in series with the input nodes of sampling comparator 203 as shown. In one embodiment, capacitors C1 and C2 are AC (alternating current) coupling capacitors. In one embodiment, capacitors C1 and C2 allow input signals Vip and Vin to be applied to the input of the capacitors C1 and C2 without potentially harming the circuit that produced those signals. If there were no capacitors then an offset calibration circuit may distort input signals Vip and Vin to squelch detector 200 and could make it operate incorrectly.

In one embodiment, the capacitances of capacitors C1 and C2 are large enough so that input signals Vip and Vin can pass easily through them but not so large that they slow down the circuit that is transmitting input signals Vip and Vin. In one embodiment, the capacitances for the capacitors C1 and C2 are in the range of 100 fF to 1 pF. In other embodiments, other values of capacitances for the capacitors C1 and C2, which may depend on area and gain constraints, may be used.

In one embodiment, ring oscillator 202 generates the clock signal Clk for sampling comparator 203. In one embodiment, ring oscillator 202 operates on a power supply different from the power supply of receiver 104 and other components of processor 2-102. For example, ring oscillator 202 operates on a power supply which is ON and available when processor 2-102 goes in sleep mode (or idle mode, or low power mode). In one embodiment, ring oscillator 202 is OFF when processor 2-102 is operating in normal power mode. In one embodiment, ring oscillator 202 comprises three or more inverting delay stages coupled together to form a ring which oscillates at frequencies above the frequency of data signals Vip and Vin.

In one embodiment, ring oscillator 202 comprises eleven delay stages to generate a clock (Clk) signal of frequency ranging from 2.5 GHz to 3 GHz. In other embodiments, other frequency ranges may be generated by programming ring oscillator 202. For example, ring oscillator 202 may be programmed by a control signal to have fewer or more delay stages. In one embodiment, capacitive loading of each delay stage of ring oscillator 202 may be adjusted using a digital signal to change the frequency of clock signal Clk.

In one embodiment, instead of using ring oscillator 202, sampling comparator 203 receives Clk signal from another source. For example, Clk signal is received from an external pin. In one embodiment, Clk signal is the same as the reference clock of a phase locked loop (PLL) which is available as a toggling clock signal during power down mode (e.g., C6 power state) of processor 2-102.

In one embodiment, sampling comparator 203 is coupled to first and second inputs (Vin+ and Vin−) and samples them using clock signal Clk generated by ring oscillator 202. In one embodiment, sampling comparator 203 updates output signals (Vo+ and Vo−) according to a phase of clock signal Clk. In one embodiment, sampling comparator 203 comprises a sense amplifier latch which is operable to sense a difference between signals on first and second inputs (Vip and Vin) with respect to a difference between first and second references (Vref1 and Vref2).

In one embodiment, sampling comparator 203 is a flip-flop based comparator. In other embodiments, other types of sampling comparators may be used that are operable to sample input differential signals using a clock signal. In one embodiment, sampling comparator 203 is operable to update the output signal when processor 2-102 is in low power mode. In one embodiment, during C6 power state (one of the low power mode states of ACPI) when the clock distribution tree is power gated, ring oscillator 202 provides the sampling clock Clk to sampling comparator 203.

In one embodiment, when the difference between Vip and Vin is greater than the difference between Vref1 and Vref2, then the output of sampling comparator 203 switches in sign. In one embodiment, sampling comparator 203 detects peaks of Vin+ and Vin−.

In one embodiment, signal pulses Vo+ and Vo− from the sampling comparator 203 are used to reset the counter of logic unit 106. In one embodiment, when there is no pulse in signals Vo+ and Vo−, the counter is stopped from counting. In one embodiment, when the counter overflows (e.g., when count value of the counter is greater than 'N' ring oscillator cycles, where 'N' is an integer), the squelch/un-squelch indicator indicates a squelch (e.g., a logical high level). In one embodiment, when sampling comparator 202 outputs pulses in Vo+ and Vo−, the counter is reset and logic unit 106 generates a squelch/un-squelch indicator which indicates an un-squelch (e.g., a logical low level). In one embodiment, outputs Vo+ and Vo− are received by a set-reset (RS) flip-flop (part of logic unit 106).

Figure 3:
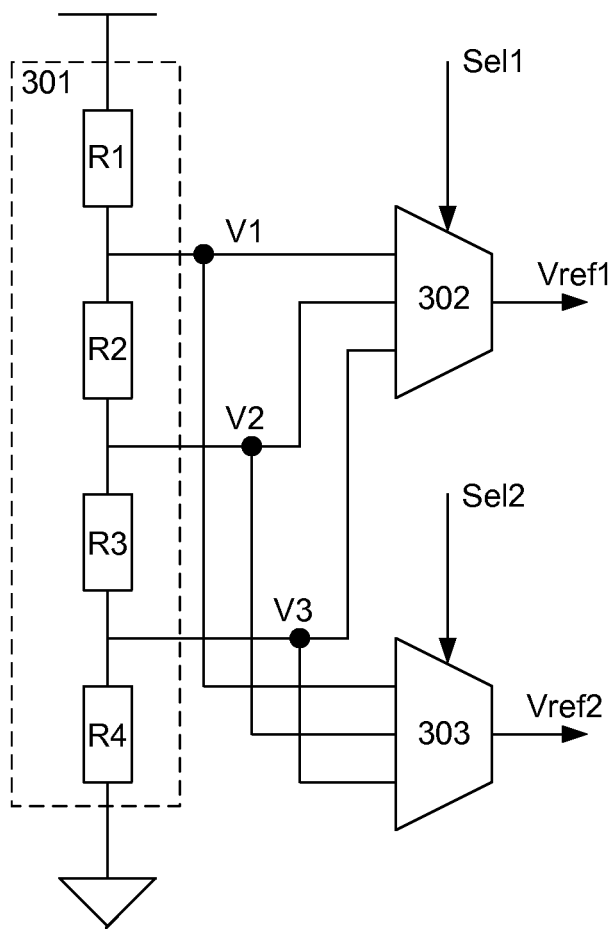
FIG. 3 is a reference generator for the comparator of the squelch detector, according to one embodiment of the disclosure.

FIG. 3 is a reference generator 300 (e.g. 201) for a comparator (e.g., sampling comparator 203) of the squelch detector, according to one embodiment of the disclosure. It is pointed out that those elements of FIG. 3 having the same reference numbers (or names) as the elements of any other figure can operate or function in any manner similar to that described, but are not limited to such.

In one embodiment, reference generator 300 is a voltage divider which is operable to provide Vref1 and Vref2 from a selection of voltage references. In one embodiment, reference generator 300 comprises a resistor stack 301 (of resistors R1-R4) providing various DC voltages V1-V3, where V1 is higher than V2, and where V2 is higher than V3. While the embodiment of FIG. 3 shows four resistors, fewer or more resistors may be used to form a voltage divider network.

In one embodiment, reference generator 300 comprises a first multiplexer 302 to selectively provide Vref1 from among the selectable voltages V1-V3 via a control signal Sel1. In one embodiment, reference generator 300 comprises a second multiplexer 303 to selectively provide Vref2 from among the selectable voltages V1-V3 via a control signal Sel2. In one embodiment, the relationship between Sel1 and Sel2 is such that voltages Vref1 and Vref2 have a difference. In one embodiment, the difference is one of V1-V2, V1-V3, and V3-V2. In other embodiments, other voltage difference between Vref1 and Vref2 is achievable by using more selectable voltages. In one embodiment, select signals Sel1 and Sel2 are generated by hardware (e.g., fuses, ROMs, RAMS, PROMs, etc.) or software (e.g., operating system), or both. In one embodiment, the difference between Vref1 and Vref2 is about 200 mV. In other embodiments, other differences may be used according to the specification of differential signals Vip and Vin.

Figure 4:
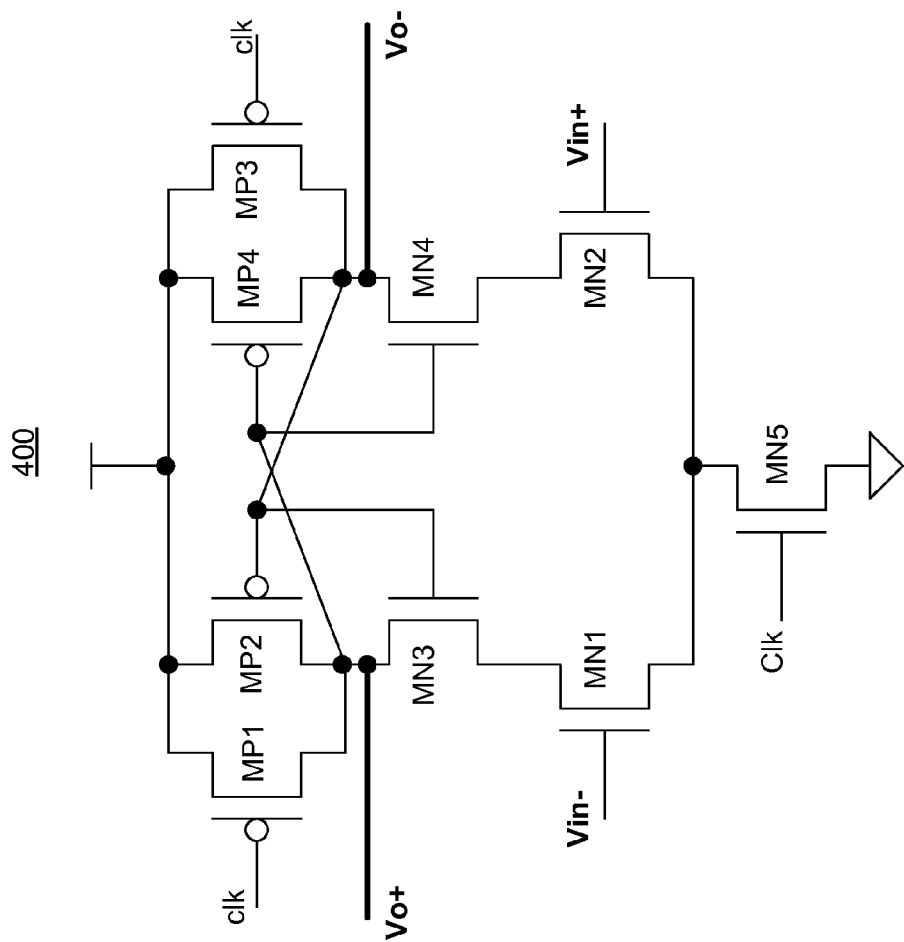
FIG. 4 is a sense amplifier latch of the squelch detector, according to one embodiment of the disclosure.

FIG. 4 is a sense amplifier latch 400 (e.g., sampling comparator 203) of the squelch detector, according to one embodiment of the disclosure. It is pointed out that those elements of FIG. 4 having the same reference numbers (or names) as the elements of any other figure can operate or function in any manner similar to that described, but are not limited to such.

In one embodiment, sense amplifier latch 400 comprises n-type input transistors MN1 and MN2 to receive input signals on nodes Vin− and Vin+. In one embodiment, cross-coupled inverting stages formed from transistors MP2 and MN3 (inverter 1), and transistors MP4 and MN4 (inverter 2) are coupled to input n-type transistors MN1 and MN2 at their respective drain terminals. In one embodiment, p-type transistors MP1 and MP3 are coupled in parallel to MP2 and MP4 to enable or disable transistors MP4 and MP2 respectively on different phases of clock signal Clk. In one embodiment, outputs Vo+ and Vo− are coupled to the drains of transistors MN3 and MN4 respectively. In one embodiment, sense amplifier latch 400 comprises a switchable current source in transistor MN5 which provides current to sense amplifier latch 400.

In one embodiment, sense amplifier latch 400 consumes far less power than any traditional amplifier or comparator because the current source MN5 is OFF during the low phase of clock signal Clk. In such an embodiment, outputs Vo+ and Vo− are held logically high by transistors MP1 and MP3 which are ON during the low phase of clock signal Clk. In one embodiment, sense amplifier latch 400 samples input signals Vin− and Vin+ during the high phase of clock signal Clk. In such an embodiment, transistor MN5 is ON and acts like a current source while transistors MP1 and MP3 are OFF.

In one embodiment, the sense (or sensing) amplifier based latch 400 has two operating phases—one operating phase is reset, and the other operating phase is evaluation. In one embodiment, during the reset operation phase, output differential nodes Vo+ and Vo− are shorted to Vcc (or Vss in a complimentary structure). In one embodiment, the back-to-back coupled inverters (MN3/MP2 and MN4/MP4) are forced to have equal input/output voltages. In one embodiment, during the evaluation operating phase, the differential pair charges the two output nodes Vo+ and Vo− at different rates because the current flowing through the differential pair is a function of input signals Vin− and Vin+. In such an embodiment, the back-to-back coupled inverters (MN3/MP2 and MN4/MP4) see a voltage difference at their inputs/outputs and operate in a positive feedback. The positive feedback causes the voltage difference to be magnified i.e., the inputs/outputs of the back-to-back coupled inverters (MN3/MP2 and MN4/MP4) grow quickly to a solid logical '1' or logical '0' levels. Hence, a small voltage at the sensing amplifier inputs (Vin− and Vin+) are magnified to a logic signal. In one embodiment, a RS (reset-set) flip-flop follows sense amplifier latch 400 stage to form a fully functional unit.

In one embodiment, when MN5 is turned ON there is a current that passes through both sides of sense amplifier latch 400. If input voltage to the gate of MN1 is higher than input voltage to the gate of MN2 then the current through the left side of sense amplifier latch 400 is higher than the right side of sense amplifier latch 400. A higher current on the left side means that the voltage drop across MP2 is larger than the voltage drop across MP4, which means that voltage at Vo+ is higher than voltage at Vo−. In this embodiment, the top portion of sense amplifier latch 400 comprises two cross-coupled inverters, where the input of each gate is coupled to the output of the other gate. These two inverters may create a positive feedback that quickly forces Vo+ to become Vcc and Vo− to become GND (ground). Through a similar analysis it can be seen that if the input voltage to the gate of MN2 is higher than the input voltage to the gate of MN1, then Vo+ is set to GND and Vo− is set to Vcc (power supply).

In one embodiment, transistors MN1 and MN2 are of the same size, transistors MN3 and MN4 are of the same size, transistors MP2 and MP4 are of the same size, and transistors MP1 and MP3 are of the same size.

Figure 5:
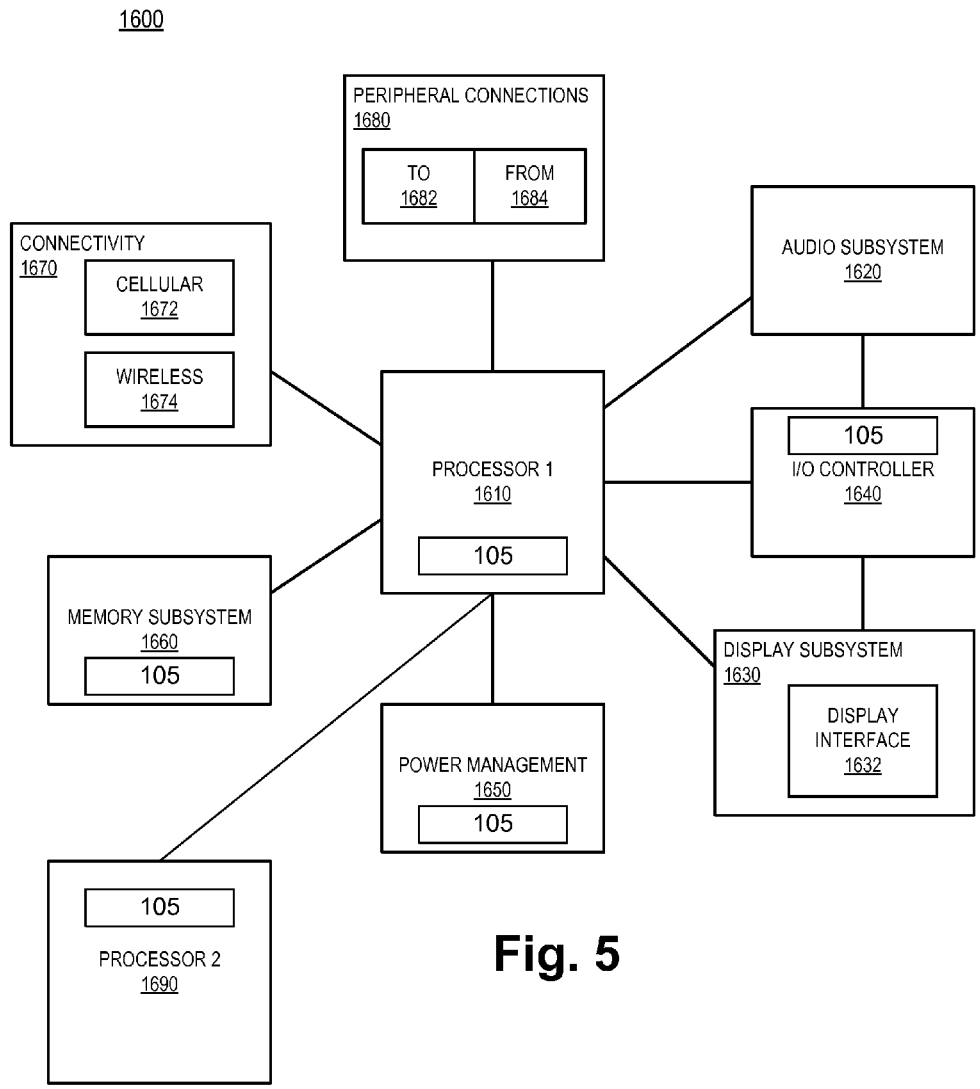
FIG. 5 is a smart device or a computer system or SOC (System-on-chip) with the squelch detector, according to one embodiment of the disclosure.

FIG. 5 is a smart device 1600 or a computer system or SOC (System-on-chip) with the squelch detector 105 (e.g., 200), according to one embodiment of the disclosure. It is pointed out that those elements of FIG. 5 having the same reference numbers (or names) as the elements of any other figure can operate or function in any manner similar to that described, but are not limited to such.

FIG. 5 also illustrates a block diagram of an embodiment of a mobile device in which flat surface interface connectors could be used. In one embodiment, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In one embodiment, computing device 1600 includes a first processor 1610 with squelch detector 105 of FIG. 1 (or 200 of FIG. 2), and a second processor 1690 with squelch detector 105 of FIG. 1 (or 200 of FIG. 2) according to the embodiments discussed. Other blocks of the computing device with I/O drivers may also include squelch detector 105 of FIG. 1 (or 200 of FIG. 2). The various embodiments of the present disclosure may also comprise a network interface within connectivity 1670 such as a wireless interface so that a system embodiment may be incorporated into a wireless device, for example, cell phone or personal digital assistant.

In one embodiment, processor 1610 can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In one embodiment, computing device 1600 includes audio subsystem 1620, which represents hardware (e.g., audio hardware and audio circuits) and software (e.g., drivers, codecs) components associated with providing audio functions to the computing device 1600. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display device, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In one embodiment, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In one embodiment, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed in this disclosure). The machine-readable medium (e.g., memory 1660) may include, but is not limited to, flash memory, optical disks, CD-ROMs, DVD ROMs, RAMs, EPROMs, EEPROMs, magnetic or optical cards, or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity 1674 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description.

For example, in one embodiment squelch detector 200 can detect and monitor a single ended signal instead of a differential signal. In such an embodiment, data signal from communication link 103 is received by one of the inputs of sense amplifier latch 400 while the other input receives a threshold voltage Vref from voltage generator 201.

The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented i.e., such specifics should be well within purview of one skilled in the art. Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described in this disclosure may also be implemented with respect to a method or process.

For example, in one embodiment an apparatus comprises: a reference generator to provide a first reference and a second reference; a first input coupled to the first reference; a second input coupled to the second reference; and a comparator coupled to the first and second inputs, the comparator to receive a clock signal and to update an output signal according to a phase of the clock signal. In one embodiment, the apparatus further comprises a ring oscillator to provide the clock signal to the comparator.

In one embodiment, the comparator comprises a sense amplifier latch which is operable to sense a difference between signals on the first and second inputs with respect to a difference between the first and second references. In one embodiment, the reference generator is operable to adjust voltage levels of the first and second references. In one embodiment, the comparator is one of: flip-flop; sense amplifier latch; or switching comparator.

In one embodiment, the apparatus further comprises a first capacitor coupled to the first input and a second capacitor coupled to the second input. In one embodiment, the comparator is operable to update the output signal when the apparatus is in low power mode.

In another example, an apparatus comprises: a ring oscillator to generate a clock signal; and a sense amplifier latch to receive differential input signals and to determine a difference between the differential input signals with respect to a difference between first and second references in response to a phase of the clock signal. In one embodiment, a reference generator is operable to generate the first and second references for the sense amplifier latch. In one embodiment, the reference generator is operable to adjust voltage levels of the first and second references.

In one embodiment, the apparatus further comprises first and second input nodes to receive the differential input signals. In one embodiment, the apparatus further comprises a first capacitor coupled to the first input node and a second capacitor coupled to the second input node.

In another example, a system comprises: a memory; and a processor, coupled to the memory, having an input-output (I/O) receiver for coupling with another processor, the I/O receiver including a squelch detector to detect a signal on a I/O pad coupled to the I/O receiver, wherein the squelch detector comprises: a reference generator to provide a first reference and a second reference; a first input coupled to the first reference; a second input coupled to the second reference; and a comparator coupled to the first and second inputs, the comparator to receive a clock signal and to update an output signal according to a phase of the clock signal.

In one embodiment, the system further comprises a wireless interface to allow the processor to communicate with another device. In one embodiment, the system further comprises a display unit. In one embodiment, the I/O receiver is compliant to PCIe I/O standard. In one embodiment, the processor further comprises a ring oscillator to provide the clock signal to the comparator.

In one embodiment, the comparator comprises a sense amplifier latch which is operable to sense a difference between signals on the first and second inputs with respect to a difference between the first and second references. In one embodiment, the reference generator is operable to adjust voltage levels of the first and second references. In one embodiment, the comparator is one of: flip-flop; sense amplifier latch; or switching comparator.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
   a reference generator to provide a first reference and a second reference;
   a first input coupled to the first reference;
   a second input coupled to the second reference, wherein the first reference is different from the second reference; and
   a comparator coupled to the first and second inputs, the comparator to receive a clock signal and to update an output signal according to a phase of the clock signal.

2. The apparatus of claim 1 further comprises a ring oscillator to provide the clock signal to the comparator.

3. The apparatus of claim 1, wherein the comparator comprises a sense amplifier latch which is operable to sense a difference between signals on the first and second inputs with respect to a difference between the first and second references.

4. The apparatus of claim 1, wherein the reference generator is operable to adjust voltage levels of the first and second references.

5. The apparatus of claim 1, wherein the comparator is one of:
   a flip-flop;
   a sense amplifier latch; or
   a switching comparator.

6. The apparatus of claim 1 further comprises a first capacitor coupled to the first input and a second capacitor coupled to the second input.

7. The apparatus of claim 1, wherein the comparator is operable to update the output signal when the apparatus is in low power mode.

8. An apparatus comprising:
   a ring oscillator to generate a clock signal; and
   a sense amplifier latch to receive differential input signals and to determine a difference between the differential input signals with respect to a difference between first and second references in response to a phase of the clock signal, wherein the first reference is different from the second reference.

9. The apparatus of claim 8 further comprises a reference generator to generate the first and second references for the sense amplifier latch.

10. The apparatus of claim 9, wherein the reference generator is operable to adjust voltage levels of the first and second references.

11. The apparatus of claim 8 further comprises first and second input nodes to receive the differential input signals.

12. The apparatus of claim 11 further comprises a first capacitor coupled to the first input node and a second capacitor coupled to the second input node.

13. A system comprising:
- a memory; and
- a processor, coupled to the memory, having an input-output (I/O) receiver for coupling with another processor, the I/O receiver including a squelch detector to detect a signal on an I/O pad coupled to the I/O receiver, wherein the squelch detector comprises:
- a reference generator to provide a first reference and a second reference;
- a first input coupled to the first reference;
- a second input coupled to the second reference, wherein the first reference is different from the second reference; and
- a comparator coupled to the first and second inputs, the comparator to receive a clock signal and to update an output signal according to a phase of the clock signal.

14. The system of claim 13 further comprises a wireless interface to allow the processor to communicate with another device.

15. The system of claim 13 further comprises a display unit.

16. The system of claim 13, wherein the I/O receiver is compliant to PCIe I/O standard.

17. The system of claim 13, wherein the processor further comprises a ring oscillator to provide the clock signal to the comparator.

18. The system of claim 13, wherein the comparator comprises a sense amplifier latch which is operable to sense a difference between signals on the first and second inputs with respect to a difference between the first and second references.

19. The system of claim 13, wherein the reference generator is operable to adjust voltage levels of the first and second references.

20. The system of claim 13, wherein the comparator is one of:
- a flip-flop;
- a sense amplifier latch; or
- a switching comparator.

* * * * *